United States Patent [19]
Spurling et al.

[11] 3,975,805
[45] Aug. 24, 1976

[54] SLIDE GUIDE RETAINER

[75] Inventors: John E. Spurling, Northridge; Jiri G. Hodek, North Hollywood; Edward J. Kessels, Burbank, all of Calif.

[73] Assignee: International Electronic Research Corporation, Burbank, Calif.

[22] Filed: Aug. 25, 1975

[21] Appl. No.: 607,247

[52] U.S. Cl. .................. 24/248 PC; 24/248 SL; 211/41; 211/45; 317/101 DH
[51] Int. Cl.² .......................................... A44B 21/00
[58] Field of Search ........... 24/243, 252 R, 252 PC, 24/248 R, 248 PC, 248 L, 248 PS, 248 GC, 248 SL; 211/41, 45

[56] References Cited
UNITED STATES PATENTS

| | | | |
|---|---|---|---|
| 1,727,200 | 9/1929 | Gillet | 24/248 PC |
| 2,553,144 | 5/1951 | Olsen | 24/248 L |

*Primary Examiner*—Bernard A. Gelak
*Attorney, Agent, or Firm*—Beehler, Mockabee, Arant, Jagger and Bachand

[57] ABSTRACT

A guide for slidably accepting opposite edges of an electronic circuit board has a rotating clamp which is open to offer zero frictional resistance when the board is slid into position. The clamp is in effect a bar rotatably mounted in an elongated retainer, the bar having a camming action against the retainer so that when the bar is rotated the entire length of the bar is pressed against the board to anchor it in place.

13 Claims, 7 Drawing Figures

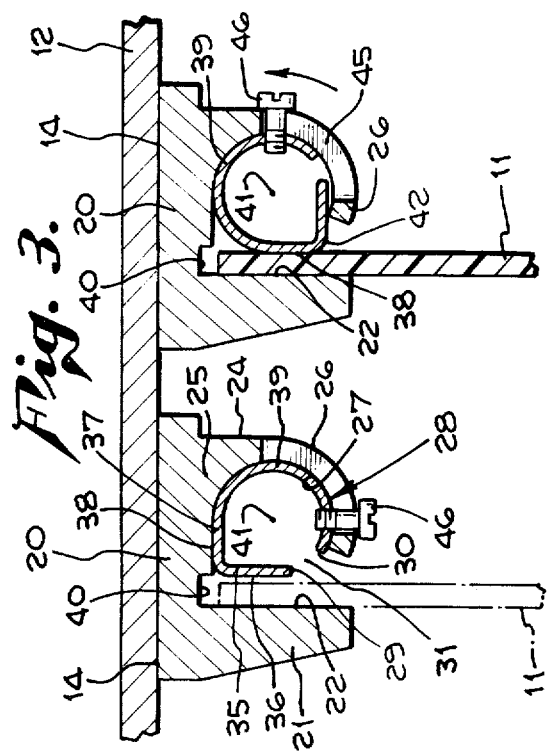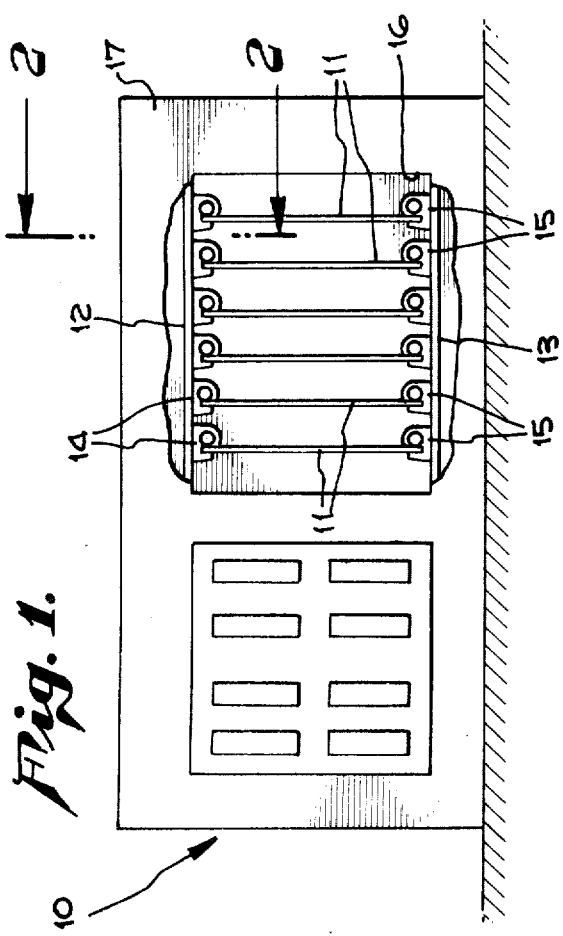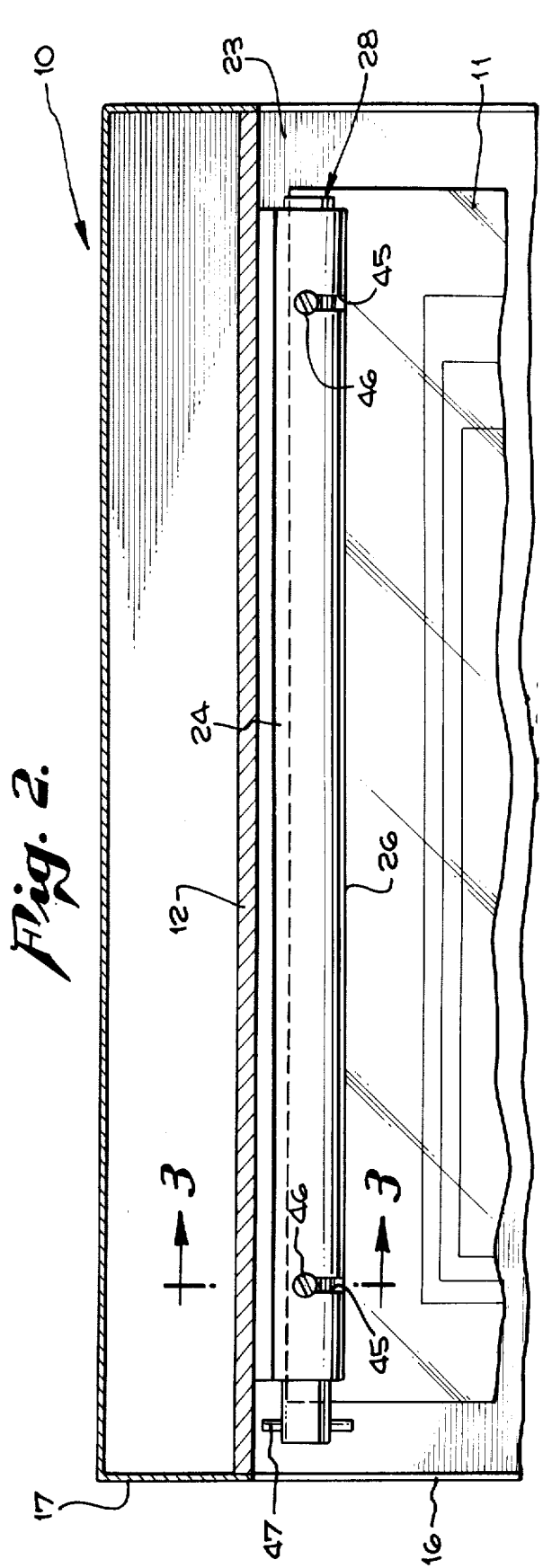

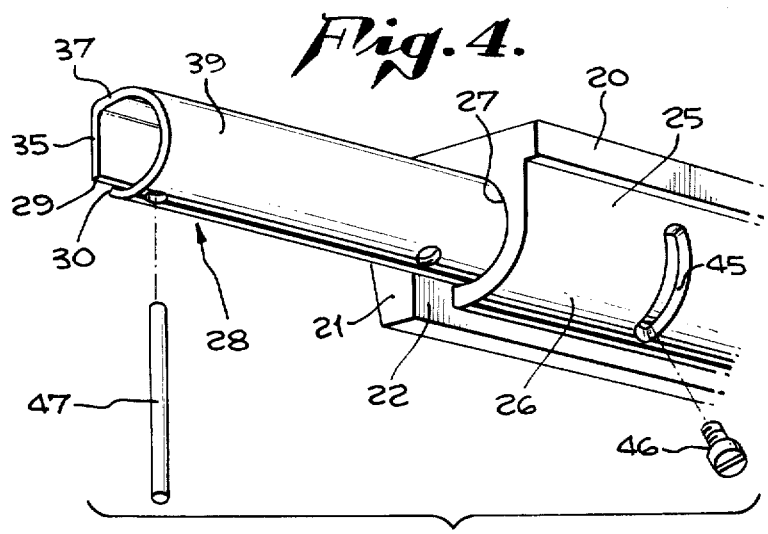
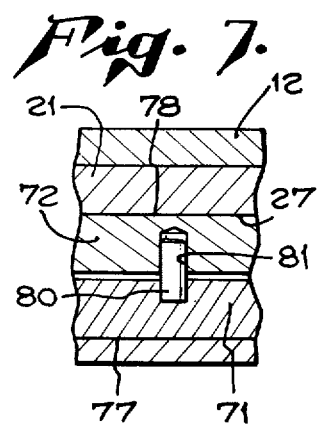
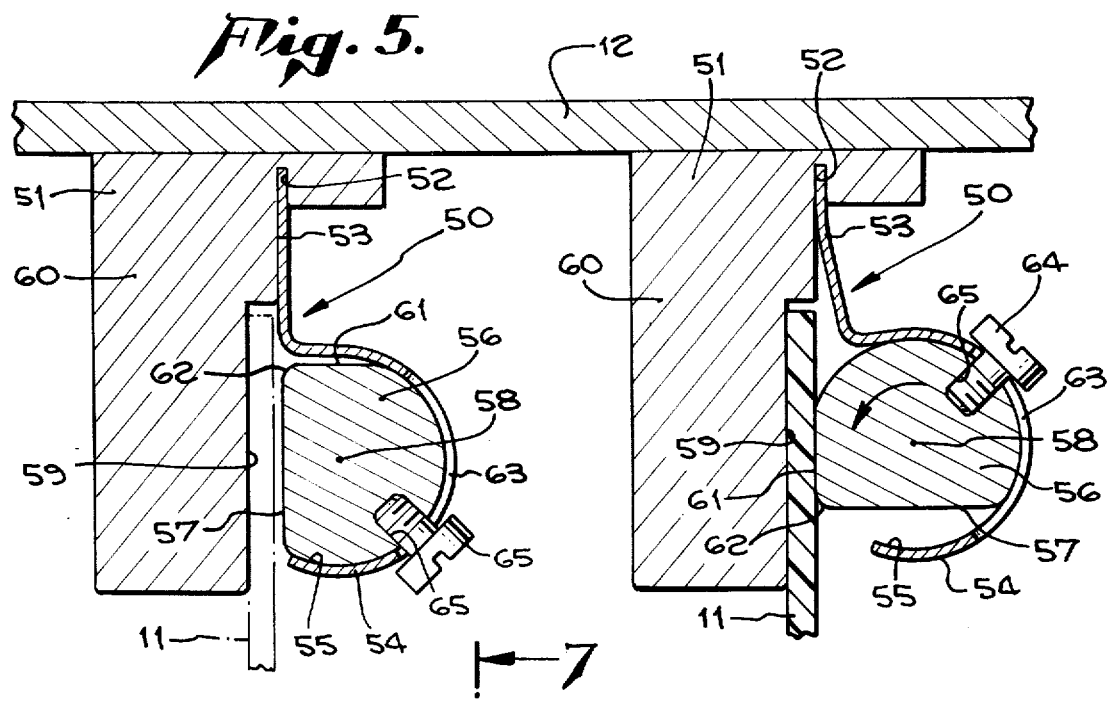
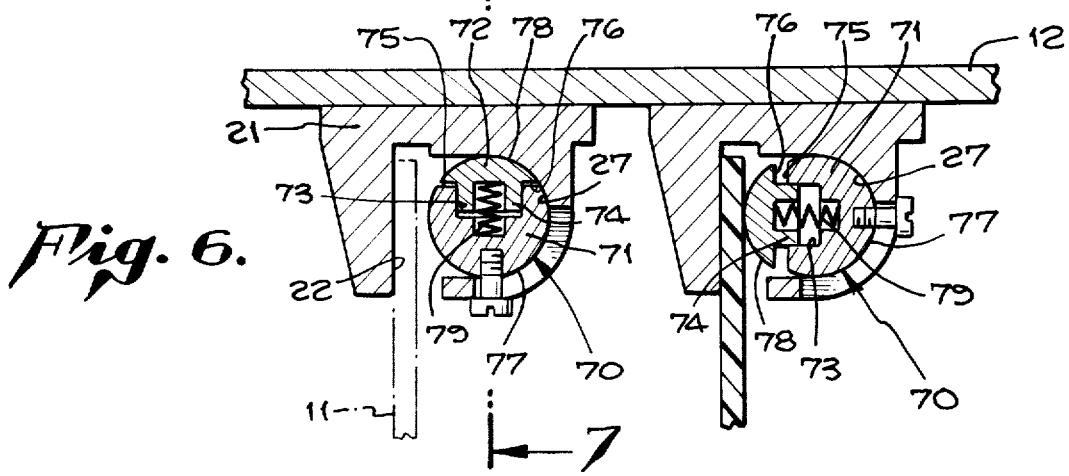

SLIDE GUIDE RETAINER

Current practice for the mounting of printed electronic circuit boards frequently makes use of a substantially rectangular box equipped with multiple pairs of guides arranged on respective inside opposite walls of the box so that the boards can be slid into place in parallel spaced relationship and there anchored in position. Two problems continually have to be faced. One is the arrangement for inserting the boards easily and quickly into proper position and in a manner which permits one or more of the boards to be removed should it be necessary, for example, to change the overall circuit pattern or perhaps to remedy some defect in an individual board.

Another problem is that of anchoring the board once in position in the box in such a manner that the effectiveness of the anchoring is not impaired or destroyed by various conditions to which the installation is subjected, as, for example, sustained vibration, moisture, heat, cold, and the like.

Various expedients have been resorted to in an attempt to meet the necessary specifications hereinabove suggested. One of the more obvious expedients has been the use of wedges acting between edge portions on the board and adjacent walls of the racks to grab and anchor the board in position. Although wedges of a proper angular disposition can be readily contrived to provide the necessary anchoring pressure, such expedients have been found to be unsatisfactory and in some instances defective. Although wedges can be readily inserted into place, after they have remained in place for an appreciable length of time, the grip becomes frozen and they can be removed only with considerable difficulty. Wedges also tend to be effected by moisture, the effect of which is to vary the grip of the wedge on the board.

Where mechanisms have been resorted to permitting all boards in a set to be inserted and then finally anchored simultaneously in position, they have not been found sufficiently dependable in that the anchoring effect on one board may be slightly different from the anchoring effect on another. Also expedients which require all boards to be loosened even though but a single board needs removal and replacement tends to diminish the dependability of the assembly because every time the hold on a board is loosened and then replaced, the effectiveness of boards which merely remain in position in the assembly have to be retested along with a new board which may be substituted for one removed. In devices of this kind where a very high degree of dependability is imperative, practices of the kind mentioned not only waste time but also appreciably impair the dependability. Furthermore, expedients which require the retesting of mountings which were in acceptable operating condition when initially installed waste time which could otherwise be put to good advantage.

It is therefore one of the objects of the invention to provide a new and improved, individual, dependable slide guide retainer for retention of printed circuit boards.

Another object of the invention is to provide a new and improved zero insertion force slide guide retainer for printed circuit boards which after insertion provides a uniform retention force throughout the edge portion of the board.

Another object of the invention is to provide a new and improved slide guide retainer for printed circuit boards, having a cam action throughout the full length of both side edges wherein the interface pressure on the edge of the board is predictable and dependable depending on the initial design of spring forces built into the cam and cam retention, thereby to provide a uniform, reliable pressure to hold the board in position.

Still another object of the invention is to provide a new and improved zero insertion force slide guide retainer which provides a predictable interface serving simultaneously as a dependable electrical ground connection and a high efficiency heat transfer connection.

Further, included among the objects of the invention is to provide a new and improved slide guide retainer of such character that in addition to operating with zero insertion force, the clamping expedient when released clears itself entirely from engagement with the board permitting the board to be extracted with zero extraction force.

Included also among the objects of the invention is to provide a new and improved slide guide retainer which is very simple in its construction, contains relatively a minimum number of parts, and of a construction which enables the relatively movable parts to be constructed simply and dependably and in a form capable of quick and easy assembly at low cost.

With these and other objects in view, the invention consists in the construction, arrangement, and combination of the various parts of the device whereby the objects contemplated are attained as hereinafter set forth, pointed out in the claims, and illustrated in the accompanying drawings:

FIG. 1 is a side elevational view of a controller cabinet assembly showing the location of the slide guide retainers when in use.

FIG. 2 is a cross-sectional view taken through the cabinet on line 2—2 of FIG. 1.

FIG. 3 is a fragmentary cross-sectional view on the line 3—3 of FIG. 2.

FIG. 4 is a fragmentary side perspective view partially exploded of one of the slide guide retainers.

FIG. 5 is a fragmentary cross-sectional view similar to FIG. 3 but showing a different form of the retainer.

FIG. 6 is fragmentary cross-sectional view similar to FIGS. 3 and 5 showing still another form of the retainer.

FIG. 7 is a fragmentary longitudinal sectional view on the line 7—7 of FIG. 6.

In an embodiment of the invention chosen for the purpose of illustration, there is shown a somewhat conventional cabinet 10 of a type adapted to have mounted therein a battery of printed circuit boards 11 in parallel spaced arrangement. The cabinet is provided with upper and lower plates 12 and 13 respectively for retention of the printed circuit boards 11 for holding upper and lower edges of each of the printed circuit boards, and there is provided a pair of respective upper and lower racks 14 and 15 which are substantially the same except for left and right hand arrangement. An opening 16 in a front panel 17 of the cabinet provides access.

As shown in the form of the invention of FIGS. 2, 3, and 4, the rack 14 consists of a block 20 fastened to the upper plate by some means such as bonding, dip brazing, threaded fasteners, or other appropriate means (not shown). The block is provided with a flange 21 presenting a flange face 22 directed inwardly. Incorporated in the block is a clamp assembly which, together with the block, extends for substantially the full depth of a chamber 23 within the cabinet except for a modest clearance at opposite ends.

The clamp assembly includes what may be described as a retention bracket 24 having a captive end 25 which is actually part of the block 20 and an arcuate free portion 26. The arcuate free portion provides an arcuate pocket 27.

Rotatably mounted in the arcuate pocket is a rod member 28 which, in this form of the invention, is tubular and constructed of some resilient metal, as, for example, beryllium copper. The rod member is split leaving edges 29 and 30 separated by a distance 31 to permit free flexure of the parts of the rod member in the transverse direction.

The rod member of further especially constructed to incorporate a flat section 35 providing a flat surface 36 and an adjacent flat section 37 providing a flat contact surface 38. These surfaces 36 and 38 are shown in right angular relationship, although the precise angular relationship may be varied from that shown. The balance of the rod member consists of an arcuate section 39 which is rotatably contained in the arcuate pocket 27.

On the left side of FIG. 3 the rod member is shown rotated to a position wherein the flat surface 38 faces the flange face 22 in parallel relationship and spaced a distance providing a slot for reception of the printed circuit board 11. The spacing is a distance in excess of the thickness of the printed circuit board in order to provide no frictional resistance of any kind whatsoever when the board is slid into position. Such freedom of sliding motion is further assured by the provision of an end recess 40.

Once the board is in position, as shown by the solid line representation on the right side of FIG. 3, the rod member 28 is rotated 90 degrees in a counterclockwise direction to a position where the flat contact surface 38 is in face to face position with the flange surface 22. The distance of the flat contact surface 38 from a center of rotation 41 is greater than the distance of the flat surface 36 from the center of rotation by an amount such that space remaining between the flat contact surface 38 and the flange surface 22 is less than the thickness of the printed circuit board 11. By the reason of the resilient character of the material which makes up the rod member, the rod member yields while the arcuate section 39 is held within and pressed against the inside surface of the arcuate pocket 27. A rounded corner 42 improves ease of rotation of the rod member 28. Between the positions on the left and right hand side of FIG. 3.

It will be noted that the distance of the flat surface 36 from the center of rotation 41 is short enough so that in the right hand location of FIG. 3, there is a clearance between the flat section 35 and the end of the arcuate free portion 26.

To limit rotation to precisely desired positions, as shown in FIG. 3, there are provided two arcuate slots 45 adjacent opposite ends of the arcuate free portion 26 of the rod member, the slots extending throughout substantially a 90° arc. Traveling in the slot in each instance is a shoulder bolt 46 which is threaded into the arcuate section 39 of the rod member. The shoulder bolt travels along the slot 45 stopping at one end or the other when one or another of the flat surfaces 36 or 38, as the case may be, is face to face with the printed circuit board 11. An idler pin 47 is provided at the front facing end of the rod member to assist in rotating it from one position to the other.

In the form of invention of FIG. 5, resilience is provided in a retention bracket 50 which is cooperatively mounted in a block 51, being anchored in an appropriate slot 52.

The retention bracket 50 has one relatively straight leg 53, the end of which occupies the slot 52, and an arcuate leg 54 providing an arcuate pocket 55. In this example the retention bracket is of resilient material such as beryllium copper.

Located in the arcuate pocket is a solid rod member 56 which, as was noted previously in connection with FIG. 2, extends with the retention bracket for substantially the full length of the edge of the circuit board 11. A flat surface 57 is located at a distance from a center of rotation 58 such that there is a slot or clearance provided between the flat surface 57 and a flange surface 59 of a flange 60 sufficient to amply clear the printed circuit board when it is being slid into the position shown on the left side of FIG. 5.

In right angular disposition with respect to the flat surface 57 is a flat contact surface 61, separated by a rounded corner 62. The distance between the contact surface 61 and the center of rotation 58 is much greater, in fact sufficiently great so that in the position on the right side of FIG. 5 the contact surface 61 tends to close the space between itself and the flange surface 59. By reason of the resilient character of the retention bracket 50, the bracket yields under this circumstance, and the resilient character of the retention bracket tends to uniformly press the contact surface 61 against the edge portion of the printed circuit board throughout the entire length of the edge portion. One of the significant factors of all forms of the invention is the uniform application of frictional force throughout substantially the entire length of the edge portion of the circuit board when it is being held in position.

To limit rotation of the solid rod member 56 in the form of invention of FIG. 5, there are provided one or more slots 63 in the arcuate leg 54, the slots extending throughout an arc of about 90° when the angular disposition of the surfaces 57 and 59 is 90°. A shoulder bolt 64 extends through the slot 63 into threaded engagement with a threaded pocket 65 in the solid rod member 56.

That portion of the solid rod 56 other than the surfaces 57 and 61 is a circularly arcuate face 66 which has substantially the same radius of curvature as the arcuate pocket 55.

In still another form of the device shown in FIG. 6, a split rod member 70 consists of complementary longitudinally extending rod elements 71 and 72. The rod member 70 is contained within substantially the same type of block and retention bracket as was described in connection with FIGS. 3, 4, and 5. A longitudinal recess 73 in the rod member 71 provides for reception of a longitudinally extending boss 74 of the rod element 72 in transverse sliding relationship. Respective shoulders 75 on the rod element 71 and 76 on the rod element 72 limit motion of the rod elements toward each other, as shown on the left side of FIG. 6. Both rod elements being provided with circularly arcuate surfaces 77 and 78, respectively, readily rotate within the arcuate pocket 27. The radius of curvature of the arcuate surfaces is of a length such that in the position on the left hand side of FIG. 6 a clearance or pocket is provided with the flange surface 22 to provide for zero friction sliding of the circuit board 11 into position.

When the rod member 70 is rotated counterclockwise 90° to the position shown on the right side of FIG. 6, a spring 79 biases the rod element 72 outwardly to a position where the arcuate surface 78 is pressed into engagement with the adjacent edge portion of the circuit board 11, the pressure being uniform throughout the length of the rod element. Such uniformity may be provided by employment of a sufficient number of the springs 79.

To further assist in uniform movement of the rod element 71, guide pins 80 in the rod element 71 sliding in pockets 81 in the rod element 72 are provided.

As has already been noted, the clamp assembly in all of the forms is freely rotatable and arranged in such fashion that there is always provided ample clearance for zero friction insertion of the printed circuit board 11 whenever the clamp assembly is rotated to open position. As the clamp assembly is rotated to clamping position, there is an appropriate camming action which brings the rod member into engagement and progressively increases pressure on the circuit board to the amount which has been built into the device. The pressure can be adjusted to virtually any appropriate amount, and such amount can be uniformly determined. Irrespective of the amount of pressure provided or how long the pressure may remain applied, when the circuit board is to be removed, rotation of the rod member immediately frees the circuit board. By rotatably confining the rod member in the arcute pocket, the contact surface in each instance is drawn free of engagement with the circuit board, and the board is immediately friction free from the confining assemblies so that it can be readily withdrawn.

Although the description has been directed largely to the mere mechanical clamping of the physical structure of the printed circuit board 11 into the cabinet, it should be understood that the same movement of the clamp assembly and the advantageous and precautionary features is useful in making electrical connections also between conventional circuit connections on the board and appropriate complementary circuit connections on, for example, the flange face 22. Here, also, uniformity and a built-in controllable loading is an important feature. It is further significant that by reason of the inherent construction of the device the clamp assembly can be made in virtually any length, shorter or longer, in proportion to the diameter as shown in the drawings.

Some noteworthy advantages are built into the structure in all forms of the invention, among which is a highly predictable interface between the board and the guide derived in part from the selection of spring metal of the rod, or the clamp, as the case may be. With a well controlled and dependable interface assured, the clamping action serves effectively both for an electrical ground and to maximize the transfer of heat accumulated in the metal core of the board to the guides and from there to the chassis or other appropriate heat sink.

Due to employment of a full pocket provided such as the pocket 55 and smooth arcuate contacting surface throughout the entire length of the board edge, galling of the mutually sliding surfaces is minimized.

The angular disposition of the two adjacent flat faces, namely the surfaces 36 and 38 of FIG. 3 and the surfaces 57 and 61 of FIG. 5, serves to provide maximum clearance when the free face is parallel to the board and uniform dependable pressure when the loaded face is in engagement.

Having described the invention, what is claimed as new in support of Letters Patent is as follows:

1. A slide guide retainer for gripping a relatively flat edge portion comprising an elongated rack for engagement with said edge portion, said rack comprising a block having a flange face extending substantially throughout the length of the rack for engagement with said edge portion, a clamp assembly extending substantially throughout the length of said rack and in spaced relationship with said flange face whereby to provide a slot for reception of said edge portion, said clamp assembly comprising a retention bracket having a captive portion in fixed relationship with said block, a transversely arcuate free portion providing an arcuate pocket, a rod member rotatably mounted in said pocket, and resilient cam means acting transversely between the rod member and the free portion of said bracket when the rod member is in one position of rotation whereby a longitudinally extending contact portion of the rod member is adapted to be pressed into engagement with said edge portion, said rod member having another position of rotation wherein a longitudinally extending adjacent portion of the rod member is adapted to occupy a position free of engagement with said edge portion.

2. A slide guide retainer as in claim 1 wherein said flange face and said rod member are coextensive with each other and adapted to extend throughout substantially the full length of said edge portion.

3. A slide guide retainer as in claim 1 wherein there is a flat contact surface extending for the length of said rod member on one side, the surface of said rod member diametrically opposite said flat surface being arcuate.

4. A slide guide retainer as in claim 1 wherein there is a stop means acting between said rod member and said retention bracket, said stop means having a stop position at one end of a rotational cycle wherein the rod member is adapted to be pressed into engagement with said edge portion and having another stop position wherein the rod member is adapted to be free of engagement with said edge portion.

5. A slide guide retainer as in claim 3 wherein there is a second flat surface in right angular relationship to said flat contact surface joining one edge of said flat contact surface, the opposite edge of said flat contact surface being joined to one edge of said arcuate free portion.

6. A slide guide retainer as in claim 1 wherein there is a key bar on said rod member extending transversely with respect thereto for rotating said rod member from one position of the rod member to the other.

7. A slide guide retainer as in claim 1 wherein the arcuate pocket extends more than halfway around said rod member whereby to retain said rod member in the pocket.

8. A slide guide retainer as in claim 4 wherein there is a shoulder on said stop means in overlying contact with the exterior of said retention bracket, whereby to retain said rod member in said arcuate pocket.

9. A slide guide retainer as in claim 1 wherein said rod member comprises a tubular wall having a split, the longitudinally extending contact portion of said wall being located at a greater distance from an axis of rotation of said rod member than the longitudinally extending adjacent portion of said wall.

10. A slide guide retainer as in claim 7 wherein there are edges on opposite sides of said split spaced from each other to allow diametrical contraction of the rod member when the rod member is in said position of engagement with said edge portion.

11. A slide retainer as in claim 7 wherein a first wall portion adjacent one side of the split is flat and a wall portion on the opposite side of the split is arcuate, there being a second flat portion of the wall between the arcuate portion and the first wall portion and disposed at substantially a right angle with respect to said first wall portion, said second flat portion being the contact portion.

12. A slide guide retainer as in claim 1 wherein said rod member is a solid element having lontigudinally extending exterior surface portions adjacent each other and at different distances from an axis of rotation thereof whereby to provide a camming action between said one position of engagement and said position free of engagement.

13. A slide guide as in claim 1 wherein said rod member comprises complementary rod elements extending throughout the length of said rod member and movable transversely one with respect to the other, one of said rod elements having thereon said longitudinally extending contact portion and the other of said rod elements having thereon said longitudinally extending adjacent portion, and resilient means acting between said rod elements in a direction biased to spread said rod elements apart.

* * * * *